US012625184B2

(12) United States Patent
Viswanathan et al.

(10) Patent No.: US 12,625,184 B2
(45) Date of Patent: May 12, 2026

(54) SYSTEM AND METHOD FOR ESTIMATION OF BATTERY STATE AND HEALTH

(71) Applicant: CARNEGIE MELLON UNIVERSITY, Pittsburgh, PA (US)

(72) Inventors: Venkatasubramanian Viswanathan, Pittsburgh, PA (US); Alexander Bills, Pittsburgh, PA (US); Shashank Sripad, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 499 days.

(21) Appl. No.: 17/406,269

(22) Filed: Aug. 19, 2021

(65) Prior Publication Data

US 2022/0057451 A1 Feb. 24, 2022

Related U.S. Application Data

(60) Provisional application No. 63/068,398, filed on Aug. 21, 2020.

(51) Int. Cl.

| | |
|---|---|
| *G01R 31/367* | (2019.01) |
| *G01R 31/378* | (2019.01) |
| *G01R 31/3842* | (2019.01) |
| *G01R 31/392* | (2019.01) |

(52) U.S. Cl.
CPC ......... *G01R 31/367* (2019.01); *G01R 31/378* (2019.01); *G01R 31/3842* (2019.01); *G01R 31/392* (2019.01)

(58) Field of Classification Search
None
See application file for complete search history.

(56) References Cited

U.S. PATENT DOCUMENTS

| | | | | |
|---|---|---|---|---|
| 8,332,342 | B1 * | 12/2012 | Saha | G01R 31/392 |
| | | | | 706/45 |
| 2015/0276881 | A1 * | 10/2015 | Liu | G01R 31/382 |
| | | | | 324/426 |
| 2016/0209472 | A1 * | 7/2016 | Chow | G01R 31/367 |
| 2017/0331323 | A1 * | 11/2017 | Ehrmantraut | H02J 7/35 |
| 2019/0018067 | A1 * | 1/2019 | Kong | G01R 31/367 |
| 2020/0011932 | A1 * | 1/2020 | Hooshmand | H01M 10/482 |
| 2020/0217901 | A1 * | 7/2020 | Sugiyama | H02J 7/00036 |

OTHER PUBLICATIONS

Chen et al., Neural Ordinary Differential Equations, 2018, 32nd Conference on Neural Information Processing Systems (NeurIPS 2018), Montréal, Canada. (Year: 2018).*
Bills et al., Universal Battery Performance and Degradation Model for Electric Aircraft, Aug. 7, 2020, ChemRxiv, (Year: 2020).*

* cited by examiner

*Primary Examiner* — Hyun D Park
(74) *Attorney, Agent, or Firm* — KDW FIRM PLLC

(57) ABSTRACT

Disclosed herein is a method for predicting the performance characteristics of a Li-ion battery over the course of the lifetime of the battery. A model based on integration of a set of ordinary differential equations is used to predict the voltage and thermal characteristics of the battery in a short period of time and a universal ordinary differential equation is used to predict the degradation of the battery by changing the parameters of the system of ordinary differential equations. The degradation of the battery is predicted in terms of change in various parameters of the battery (e.g., capacity, resistance, thermal behavior).

10 Claims, 7 Drawing Sheets

FIG. 4

SYSTEM AND METHOD FOR ESTIMATION OF BATTERY STATE AND HEALTH

RELATED APPLICATIONS

This application claims the benefit of U.S. Provisional Patent Application No. 63/068,398, filed Aug. 21, 2020, the contents of which are incorporated herein in their entirety.

BACKGROUND

The invention described herein pertains to the field of lithium-ion (Li-ion) batteries. Li-ion batteries are widely used in various industries due to their high energy density. Monitoring of the available energy of a Li-ion battery is important for iterative design procedures, safety considerations, and other applications in any industry which widely uses Li-ion batteries, including, for example, electrified mobility, electric grid and personal electronics.

The improving performance, increasing cycle life, and decreasing cost of Li-ion batteries spurred by the mass market adoption of personal electronics and electric vehicles (EV) has recently enabled the development of electric aircraft. Electric aircraft convert energy stored in on-board batteries to propulsive thrust through a high voltage distribution bus, an electric motor, and a power inverter. This mode of propulsive energy transfer eliminates the complexity typically associated with gearboxes or mechanical transmissions, affords relatively low unit costs of propulsors (inverter, motor, propeller), and increases overall powertrain efficiency compared to internal combustion or turbine engine systems. This paradigm shift in the aircraft propulsion system has enabled a vast array of new hybrid and electric aircraft configurations.

Many electric aircraft designs utilize distributed electric propulsion to realize novel configurations which can achieve a significant safety and efficiency advantage over conventional single or multi-engine aircraft. Notably, the developments in battery technology and distributed electric propulsion have opened the door to urban air mobility (UAM) by enabling the development of electric vertical takeoff and landing (eVTOL) aircraft. As outlined by the National Aeronautics and Space Administration (NASA), UAM aims to safely and efficiently transport passengers and cargo in an urban area. UAM has obvious benefits of convenience and speed for mobility in some markets and may also have an energy-efficiency advantage over ground transport.

The design trade-offs that arise from using Li-ion batteries for electric aircraft designs are distinct from those with combustion engines, in large part due to the orders of magnitude difference in specific energy between Li-ion batteries and jet-fuel. Compared to terrestrial electric vehicles, the performance of aircraft is much more sensitive to battery weight. Thus, electric aircraft require careful integration and use of Li-ion battery systems. Most eVTOL aircraft are designed for the critical case: cruise to maximum range into a headwind, followed by a redirect reserve segment and a subsequent contingency landing such as a single propulsor failure. This mission profile is especially challenging to achieve close to the battery retirement state-of-health (SOH, retirement SOH is typically 80-85%), as maximum power output is demanded at a low state-of-charge (SOC). To ensure that the co-design of electric propulsion sub-systems is consistent with the sized vehicle geometry and weights, a rapid battery performance estimation method is required in the sizing loop. Importantly, the model must be supplemented with a degradation model to account for changes in performance over the lifetime of the battery.

Estimating the state-of-charge over a duty cycle and the state-of-health over the lifetime of a cell has historically been performed using physics based models or empirical and data-driven machine learning models. While physical models are typically interpretable and accurate, they can often be computationally expensive. On the other hand, empirical and machine learning approaches trade interpretability for speed, while retaining accuracy. The physics-informed machine learning approach can help overcome this trade-off.

In fields such as atomistic simulations and fluid mechanics, encoding physical principles for data efficiency and extrapolation in machine learning methods such as neural networks has shown promising results. Machine learning has been used extensively in the field of energy storage, including being used to optimize charging protocols with closed loop and reinforcement learning based methods, to predict the cycle life of batteries based on early cycle features, and to predict and forecast a battery's state of health. However, there have been few works which closely integrate electrochemical battery models and constraints with machine learning methods to improve performance predictions over the full life of a battery.

SUMMARY OF THE INVENTION

The invention described herein comprises a method for predicting the performance characteristics of a Li-ion battery over the course of the lifetime of the battery. The lifetime of the battery includes a large number of charge, discharge and rest cycles. A model based on integration of a set of ordinary differential equations is used to predict the voltage and thermal characteristics of the battery in a short period of time and a universal ordinary differential equation is used to predict the degradation of the battery by changing the parameters of the system of ordinary differential equations. The degradation of the battery is predicted in terms of change in various parameters of the battery (e.g., capacity, resistance, thermal behavior).

The models presented herein are physics-informed machine-learning models for battery performance, thermal response, and degradation. The models begin with a simplified electrochemical-thermal cell model which can quickly predict the performance of the cell for a duty cycle. A mechanistic degradation model which includes components for modeling solid electrolyte inter phase (SEI) growth, lithium plating, and active material loss is then added. A universal ordinary differential equation (uODE) is used to improve the accuracy of the degradation model.

The invention is explained herein in the context of the use of Li-ion batteries to power eVTOL aircraft, although, as would be realized by one of skill in the art, the method is applicable to many other applications wherein Li-ion batteries are used as the primary power source.

BRIEF DESCRIPTION OF THE DRAWINGS

FIG. 4 is a series of graphs showing voltage and temperature predictions by the method of the invention over the lifetime of the cells.

DEFINITIONS

Figure 1:
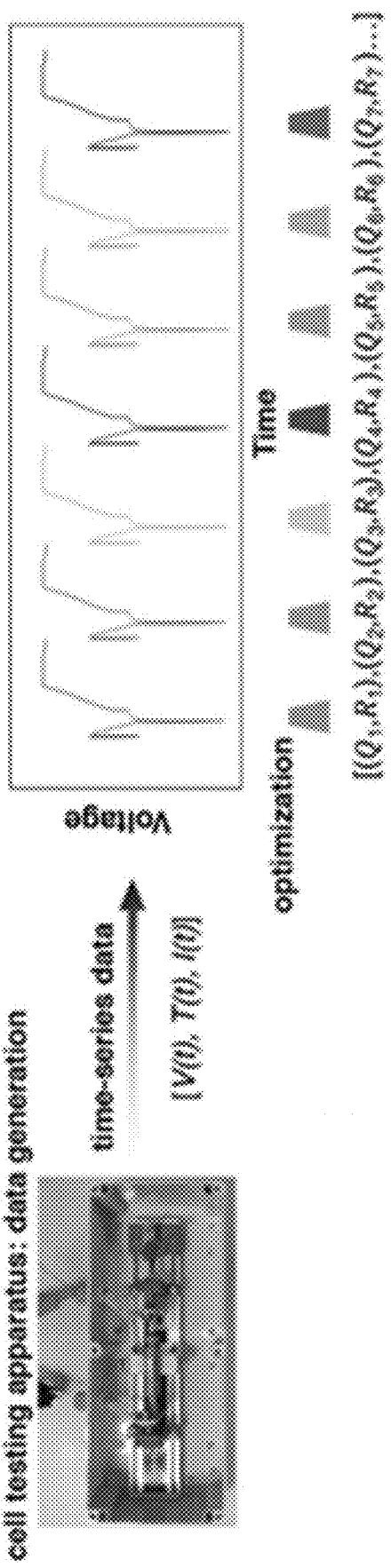
FIG. 1 is a schematic representation of the method of the invention.
Figure 2:
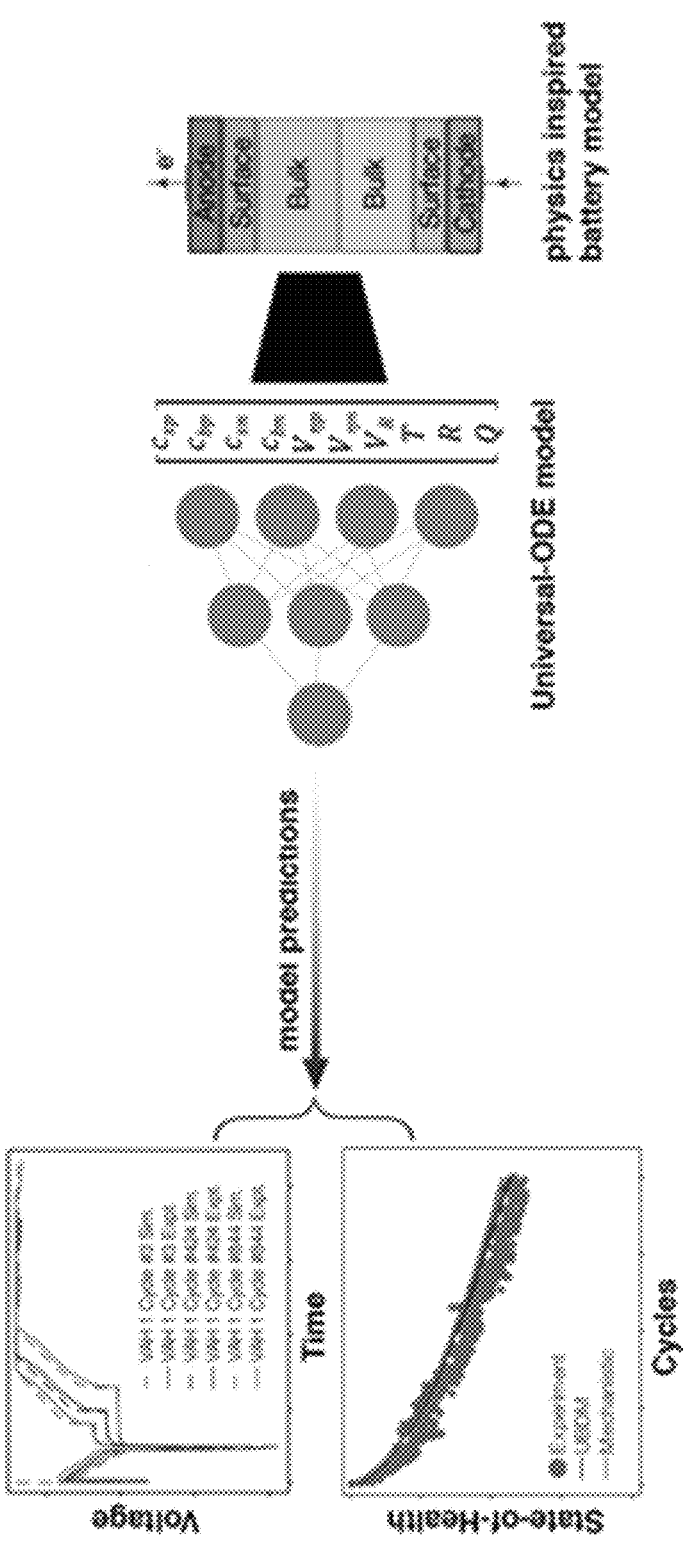
FIG. 2 is a schematic representation of the model of the invention.

As used herein, the term "neural network" should be interpreted as any universal function approximator, including, but not limited to neural networks and random forests.

As used herein, the term "eVTOL" should be interpreted to include both eVTOL and eSTOL aircraft.

DETAILED DESCRIPTION

The method of the invention consists of two different models, a performance model and a degradation model, which model the performance and life of a Li-ion battery used in, for example, an electric vertical take-off and landing (eVTOL) aircraft or an electric short take-off and landing (eSTOL) aircraft.

The performance model is used to predict the discharge characteristics of a Li-ion battery, including voltage, temperature, and state of charge. The performance model consists of a number of parameters, which may or may not change with aging. The performance model uses a Neural Ordinary Differential Equation, which uses a universal function approximator to approximate the derivative of a quantity, in addition to mechanistic models to predict the performance.

The degradation model is used to predict the change in the performance model to model the changes in performance of a Li-ion battery over the course of its lifetime. The degradation model uses a Neural Ordinary Differential Equation, which uses a universal function approximator to approximate the derivative of a quantity, in addition to mechanistic degradation models, to predict degradation of the performance model. This approach allows for the model to learn degradation mechanisms present in experimental data which could not be learned using mechanistic degradation models. Additionally, the degradation model allows use of the model with different chemistries of Li-ion batteries, which could not be predicted with purely mechanistic models. This allows for high accuracy in prediction of degradation. Additionally, the incorporation of the degradation into the performance model allows for accurate prediction of performance characteristics throughout the lifetime of the battery.

eVTOL Battery Dataset Generation

The development of machine learning-based models requires relevant battery performance datasets to train and test the models. While datasets exist for testing Li-ion performance under a few duty cycles, the limited number of openly-available datasets remains a challenge to bring advanced machine-learning methods to battery performance prediction. Additionally, there are no openly accessible datasets which follow the characteristic eVTOL duty cycle. To fill this gap, an experimental battery performance dataset specific to the power requirements of an eVTOL is generated. The dataset was generated using 22 cells which sample a variety of operating conditions an eVTOL might experience during normal operation.

The mission profiles follow the same generic format in all cases: (i) Take-off: the cell is discharged at a high constant power for a period, $t_{to}$; (ii) Cruise: the cell is discharged at a lower constant power for a longer duration, $t_{cr}$; (iii) Landing: the cell is discharged at high constant power (same rate as takeoff) for a slightly longer period of time, $t_{la}$; (iv) Rest: the cell is allowed to rest until it cools to a temperature of less than 27° C.; (v) Charging: the cell is charged using a constant current-constant voltage (CC-CV) charging protocol; and (vi) Rest: The cell is allowed to rest until cell temperature has reached 35° C., then allowed to rest 15 minutes further before beginning the next cycle.

Every 50 cycles, each cell undergoes a capacity test wherein it is discharged at constant current until its voltage is less than 2.5V. The cells were cycled until they reached less than 2.5V or a temperature of greater than 70° C. during a typical discharge (mission profile) cycle. During each test, temperature, voltage, and current along with discharge capacity and charge capacity are recorded. The baseline profile is parameterized to test different conditions which could be encountered on a mission. Specifically, the discharge power during flight, charge current, charge voltage, ambient temperature, and cruise length are varied in a one-at-a-time fashion. As explained below, the cells are divided into a training dataset and a test dataset to train and test the models. The test set is further divided into extrapolative tests (conditions outside those encountered in the training set) and interpolative tests (conditions similar to those in the training sets) to facilitate further analysis of model performance.

FIG. 1 shows a schematic representation of the data generation and the apparatus used to generate the data. The apparatus produces a time-series data set comprising current, voltage, and temperature. The time-series data are divided into cycles, each corresponding to one mission comprising takeoff, cruise, landing, and charge segments. A reduced-order electrochemical model is trained on the first cycle from each cell.

Performance Modeling and Parameter Estimation

For performance modeling, a physics inspired model that obeys mass and charge conservation laws is used. The Redlich-Kister polynomial approximation is used to obtain a functional form for the equilibrium voltage of the cell. The equilibrium voltage is forced to monotonically increase with state of charge, thus forcing compliance with the second law of thermodynamics. A diffusion-like equation is used to model transport between and within the electrodes, and conservation of charge is enforced within this equation. Electrochemical reaction kinetics is modeled with the Butler-Volmer equation. The parameters used in this model cannot be directly obtained from physical measurements. However, they are physically motivated and correspond to processes which include electrochemical reactions, reaction kinetics, and transport. This combination strikes a compromise between accuracy, computational speed, and interpretability of the model. More details of the performance model is described later herein.

Parameter estimation for the performance model is performed against the training portion of the experimentally generated eVTOL battery performance dataset. Specifically, the first cycle of each cell is used. A subset of the parameters of the performance model is chosen to capture the evolution of the performance model as the battery ages, this subset is referred to herein as the aging parameters. The parameters of the performance model that do not evolve as the battery ages will be referred to as the performance parameters. A third set of parameters that governs how the aging parameters change over time are introduced later herein.

Parameters of battery models are often difficult to identify using local optimization methods. Furthermore, the dimensionality of both the performance parameters and the aging parameters makes using global optimization tractable for these sets. For the performance parameters, simulated annealing was used due to its ability to overcome local minima, computational feasibility in intermediate dimensionalities (18 parameters), and empirically observed good performance. For the aging parameters, an adaptive grid-based method was used due to its high accuracy and because the low dimensionality of the aging parameters makes it tractable. The loss function used to estimate the parameters of the model is tuned to emphasize the quantities most important to the design of eVTOLs, namely, voltage error, thermal error, and maximum temperature.

Figure 4:
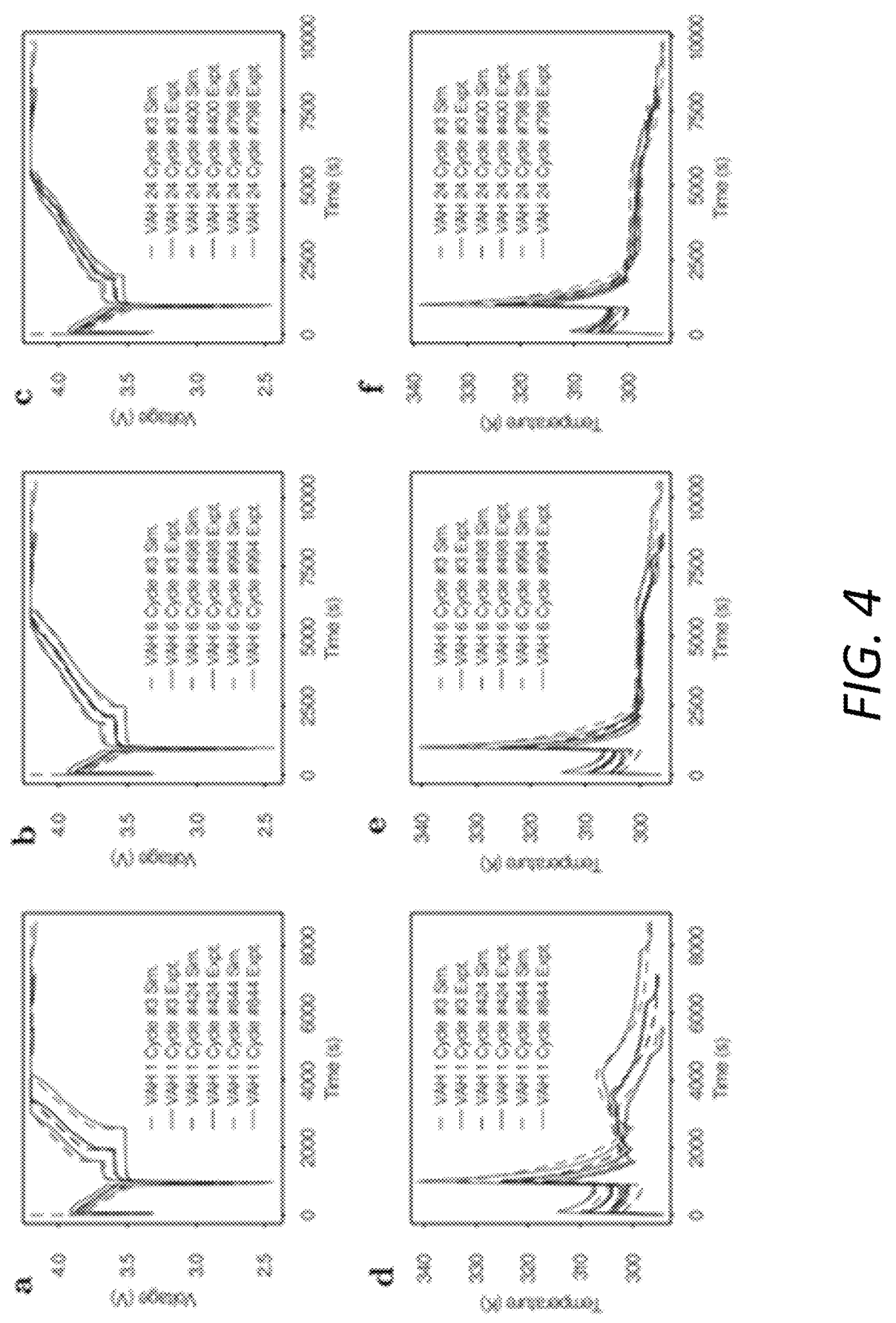

Cell voltage and temperature predictions from the invention for six cells at different points in their lifetimes are shown in FIG. 4. Voltage (FIGS. 4a-4c) and Temperature (FIGS. 4d-4f) predictions along with experimental data for three cells in the dataset. From left to right, the cells shown are identified by serial numbers VAH01, VAH06, and VAH24. The cells are each shown at a discharge cycle in the beginning, middle, and end of their lives. Importantly, the accuracy of predictions is maintained even at the end of high discharge rate landing segment, which is critical for safe design and operation of eVTOLs and is generally hard to predict. Additionally, the performance predictions are consistently accurate across the lifetime of the cell, including the beginning and end of usable life. Two of these missions (VAH01 and VAH06) are in the training set, meaning that the 1st cycle from each of these cells has been used for performance parameter estimation (aging parameter estimation is performed for all cycles here, and their prediction will be discussed later). However, the later cycles have not been used in parameter estimation, meaning that the discharge curves shown have not been used directly for estimation of the performance parameters. As identified previously, particularly important for the application of eVTOL design, the model accurately predicts the highest temperature of the cell in all cases.

Aging Modeling

Figure 5:
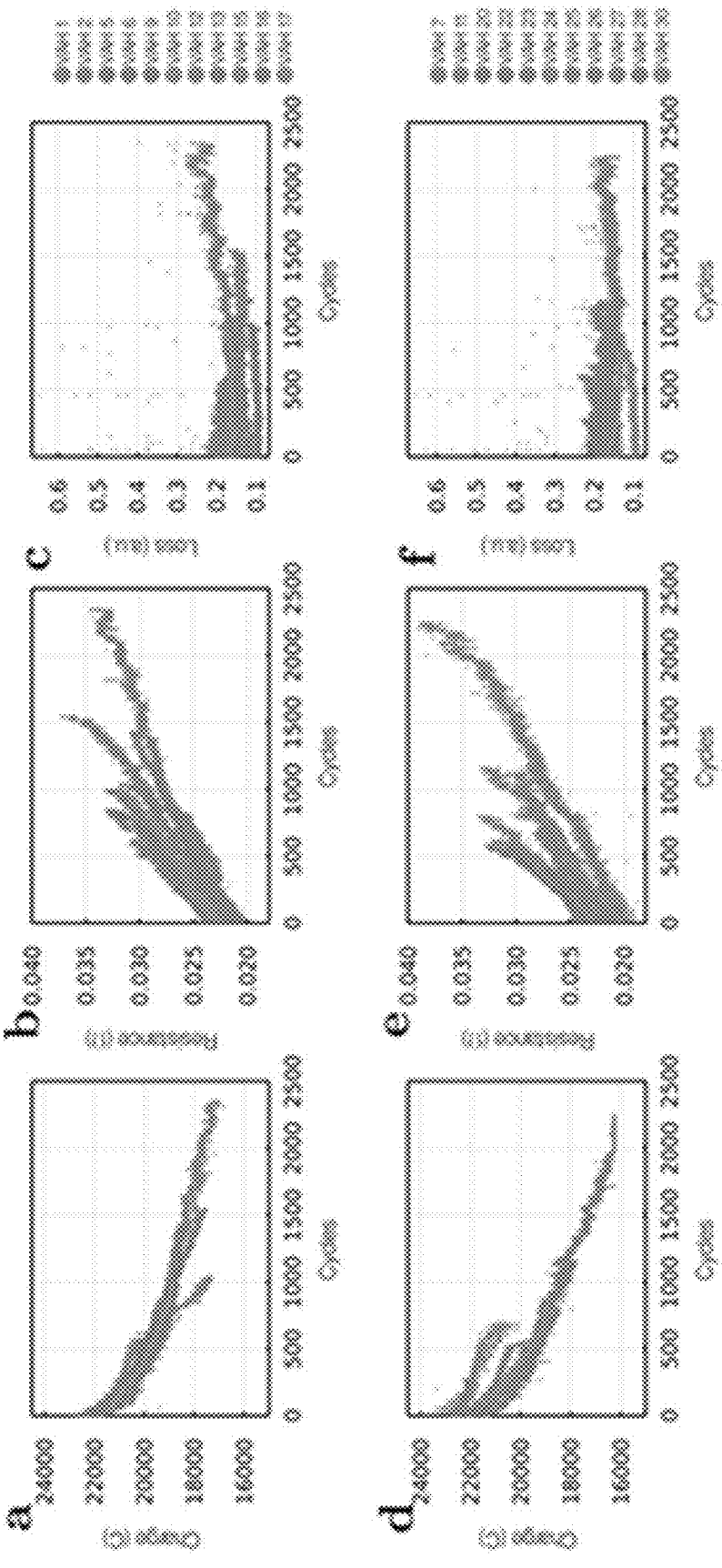
FIG. 5 is a series of graphs showing data generated from all cell and cycles.

The discharge curves shown in FIG. 5 are important to model throughout the life of the aircraft to inform design decisions based on changes in the battery performance characteristics over time and to ensure that the critical design case (when the battery is near end of life) can be properly accounted for in the design process. To model the changes in performance characteristics over the life of the battery, the aging parameters must be allowed to evolve over the life of the battery, and a model must be developed to evolve those parameters.

To estimate and model the aging parameters, those parameters must first be selected. This, in a process akin to hyperparameter optimization, is accomplished by first picking a set of initial parameters (typically based on physical intuition), then calculating the loss function for each cycle of the cell. The aging parameters are the smallest set of parameters which produce a loss function which, over the life of the cell, is low and flat. This indicates that the model, with estimated aging parameters and constant non-aging performance parameters, is accurate and remains accurate for the duration of the life of the cell. An objective function (e.g., deviation from initial loss, could be used to evaluate whether the parameter set is sufficient to capture the variations.

FIG. 5 shows the generated data from all cells and cycles. The top row (FIGS. 5a-5c) is the training set, while the bottom row (FIGS. 5d-5f) is the test set. From left to right, columns show total charge (FIGS. 5a, 5d), cell resistance (FIGS. 5b, 5e), and the loss function (FIGS. 5c, 5f). Charge shows expected trends, with large declines early in the life of the cell indicating the formation of SEI, and roughly linear trends in the middle of life. A few cells show indications of accelerated aging or kneepoint onset characteristic of Li-ion batteries late in life. Resistance is roughly linearly increasing, with some cells sub-linear and some super-linear. Loss functions stay relatively low and flat throughout the life of the cell, indicating correct selection of aging parameters corresponding to degradation modes.

The loss function graphs show the evolution of the loss function with cycle life for the training set. The performance parameters have been estimated using the first cycle from each cell. The aging parameters for each cycle are estimated directly using the grid-based approach. The loss function does not substantially increase for most cycles with increasing cycle number and stays relatively low throughout the cycles. The charge graphs show resistance for the training and testing set respectively, while the cell resistance graphs show total available charge for the training and testing sets. Both resistance and charge show reasonable values for this cell (the charge parameter can be converted to a capacity by multiplying by the estimated filling fraction, which at the beginning of life results in a capacity of around 3 mAh). Additionally, they both follow established trends, with resistance following a roughly linear profile with different cells deviating to superlinear or sublinear processes, and charge being roughly proportional to the inverse square root of time near the beginning of life, followed by a linear period. Once the aging parameters are fit to each cycle, a degradation model which governs the evolution of those parameters can be fit to the generated data.

There are several advantages to the degradation modeling approach followed here. Firstly, the parameter estimation process for each cycle over the lifetime of the battery (the aging parameters) can be conducted independently, and, therefore, can be conducted in parallel, utilizing modern high performance computing architectures such as multi-core architectures and graphics processing units. Estimating the parameters in parallel theoretically allows the estimation of the parameters for each cycle over entire lifetime of a battery in the time required for a single cycle. Secondly, this approach results in accurate prediction of discharge characteristics throughout the battery's lifetime, which is vital for design, analysis, and safe operation of electric aircraft. Thirdly, the approach is model-agnostic, meaning that the degradation model can be physics-based, empirical, data driven, or any combination thereof.

Degradation Modeling

Figure 3:
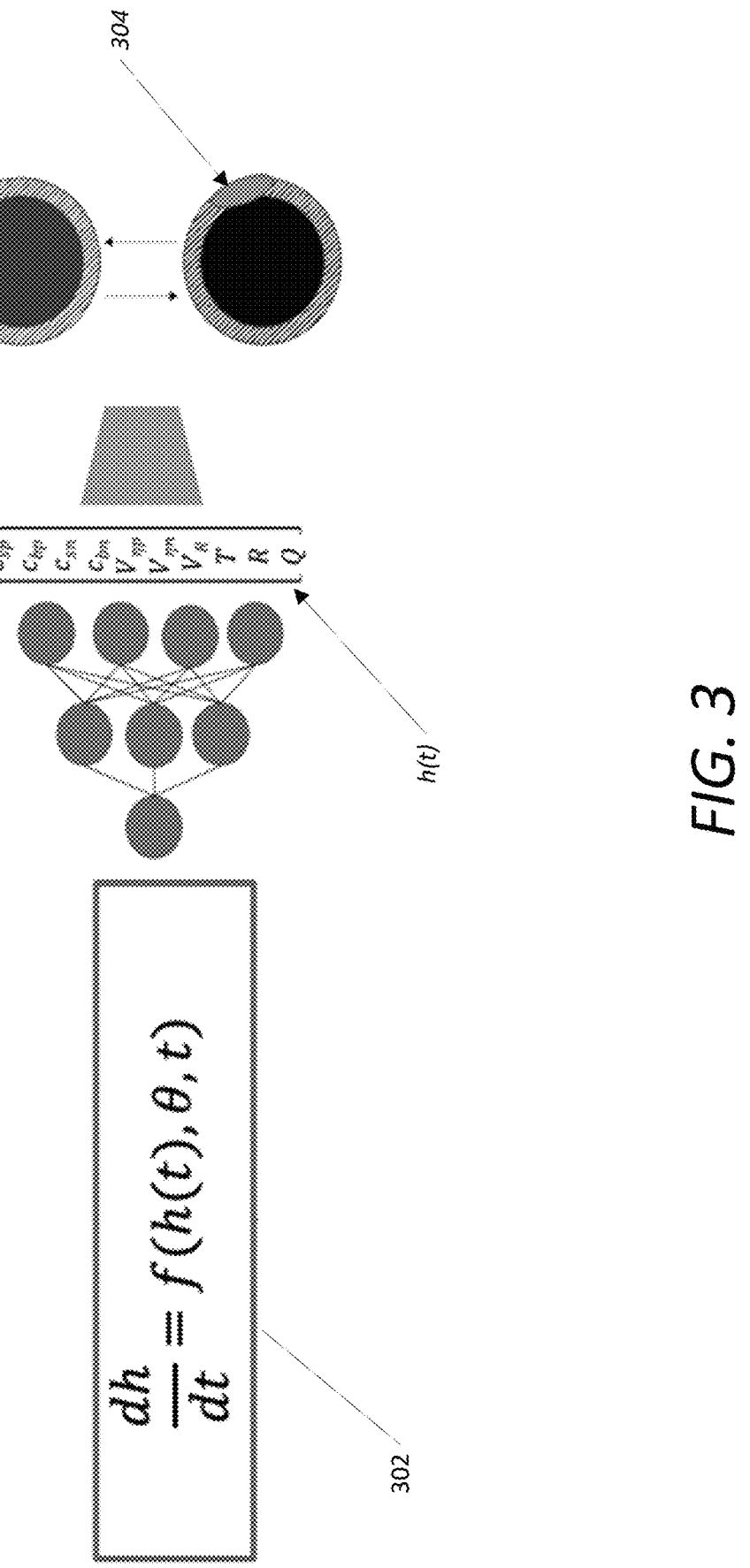
FIG. 3 is a schematic representation of the degradation model using in this invention to predict degradation of the battery over the course of its lifetime.

Two degradation models were developed: a physics-based mechanistic degradation model (MDM), which includes contributions from three different degradation mechanisms: SEI growth, lithium plating, and active material loss and a novel approach, called the universal battery degradation model (UBDM), which is based on neural differential equations and universal ordinary differential equations. In the UBDM, a neural network is used to calculate the residual loss of lithium inventory and ohmic resistance gain. A schematic representation of the degradation model is shown in FIG. 3. The input feature to the neural network is the (normalized) state vector 302 generated by the reduced order electrochemical model, thus allowing the network to have access to features such as positive and negative electrode lithium concentrations and surface overpotentials, all of which could be important for degradation. Any mechanistic model can be substituted for the currently used mechanistic model in the UBDM, to account for changes in chemistry, operating conditions, cell models, etc. Additionally, any non-mechanistic model can be substituted for the simple neural network used for the non-mechanistic model. The circular features to the right of FIG. 3 show a battery having no SEI growth (top) and a battery with SEI growth 304 bottom).

The MDM and UBDM are then trained alongside each other. For the estimation of these parameters, due to the high dimensionality and lack of interpretability of the neural network, a local optimization method (Adam) was used. The loss function for this estimation is the weighted sum of the mean square errors of resistance and charge.

Figure 6:
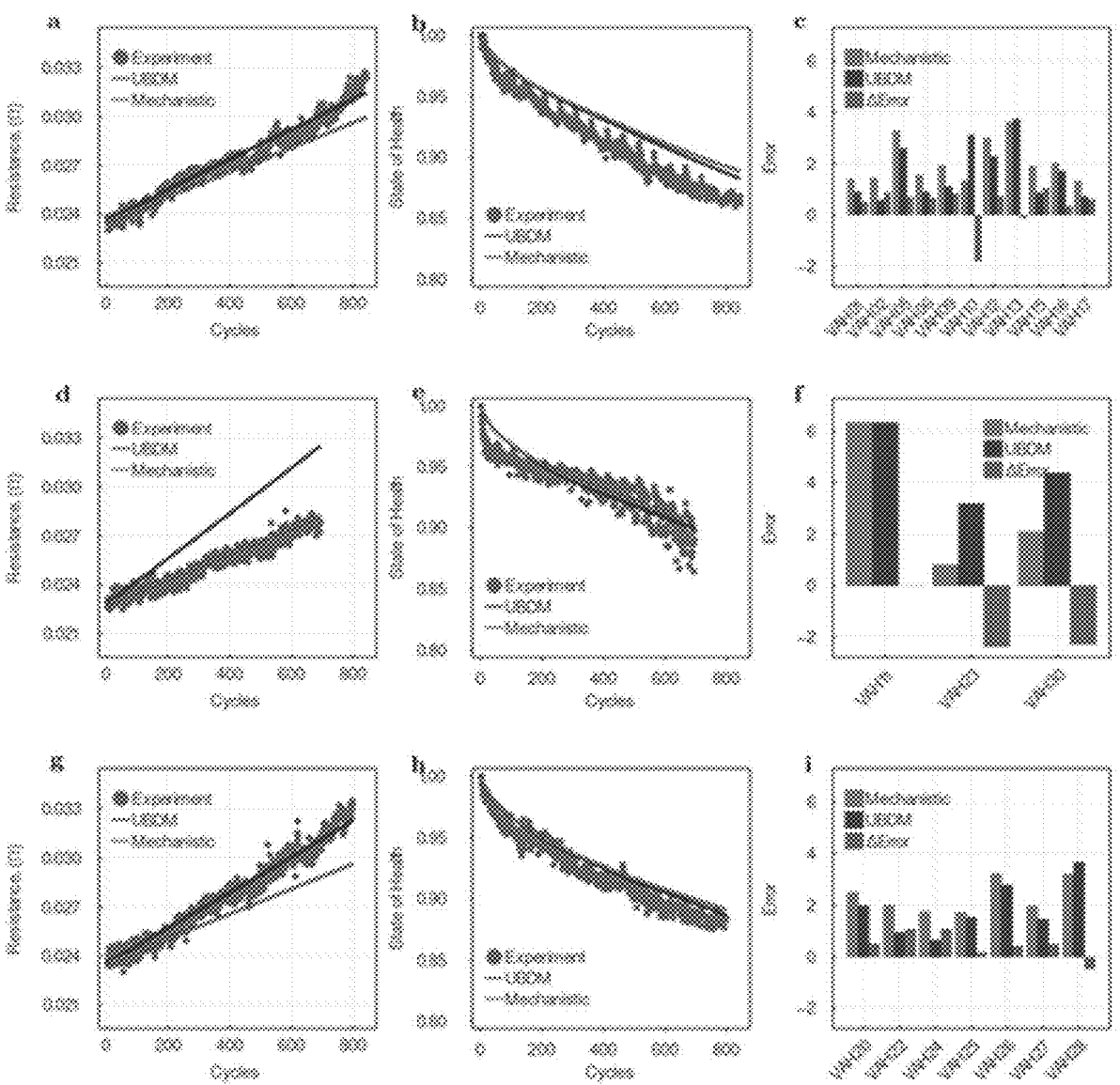
FIG. 6 is a series of graphs showing a comparison of the UBDM and MDM degradation models.

FIG. 6 shows a comparison of the UBDM and the MDM. From top to bottom, rows show VAH01 (FIGS. 6a-6c) from the training set, VAH23 (FIGS. 6d-6f) from the extrapolative test set, and VAH24 (FIGS. 6g-6i) from the interpolative test set. From left to right, the columns show a comparison of resistance from the generated data and the UBDM and the MDM, a comparison of charge from the generated data and the UBDM and the MDM, and the calculated loss function from each cycle.

FIGS. 6c, 6f, 6i show the total error experienced by training and both test sets. For the training set and the interpolative test set, the UBDM outperforms the MDM. In the training set, the error of the UBDM shows a 18.94% improvement over the MDM. 11 of 13 cells in the training set show improved prediction accuracy, excluding the high temperature cell and a lower cruise cell. In the interpolative testing set, the UBDM shows a 20.30% improvement over the MDM, with 6 of 7 cells showing improved accuracy, excluding a lower power cell. On the other hand, the UBDM performs worse than the MDM on the extrapolative testing set. For the cells VAH11, VAH23, and VAH30, featuring low power (80%), low charging voltage (4.1V), and highest temperature (35° C.), the UBDM shows a decrease in accuracy of around 33%. Interestingly, the UBDM and MDM accuracy are nearly the same for VAH11 (low power), while it is worse for VAH30 (high temperature) and VAH23 (low charging voltage). For VAH07 (featuring a charging voltage of 4.0V), both the MDM and the UBDM exhibit an overdischarge condition before reaching the end of life, making their loss function value incomparable. However, the condition occurs faster for the UBDM, indicating worse prediction accuracy. The first two columns of FIG. 6 provide some deeper insight on these results. The first row corresponds to VAH01, the baseline case. In this case, the resistance (FIG. 6a) increases more than the MDM alone would indicate. The UBDM corrects this by increasing the rate of change of resistance. The same effect is seen in the third row with VAH24, from the interpolative test set (FIG. 6g). However, in the second row, which corresponds to VAH23 (the baseline case but only charged to 4.0V rather than 4.2V), the actual resistance is predicted well by the MDM, yet the UBDM has not learned this bifurcation (FIG. 6d). The model was not trained on any cases in which the charging voltage was lower than 4.2V. In some cases, the UBDM is able to learn when resistance should be sublinear, such as in VAH12. More training data, or an accurate representation of all conditions which could be encountered by an eVTOL (essentially eliminating all possibility of extrapolation) would greatly increase the accuracy of the UBDM. The UBDM performs better on the charge estimation on the extrapolative test set. In all cases shown here, the UBDM outperforms the MDM on charge estimation, correcting it to account for lower charge. All training and test cases are available in the supporting information.

Figure 7:
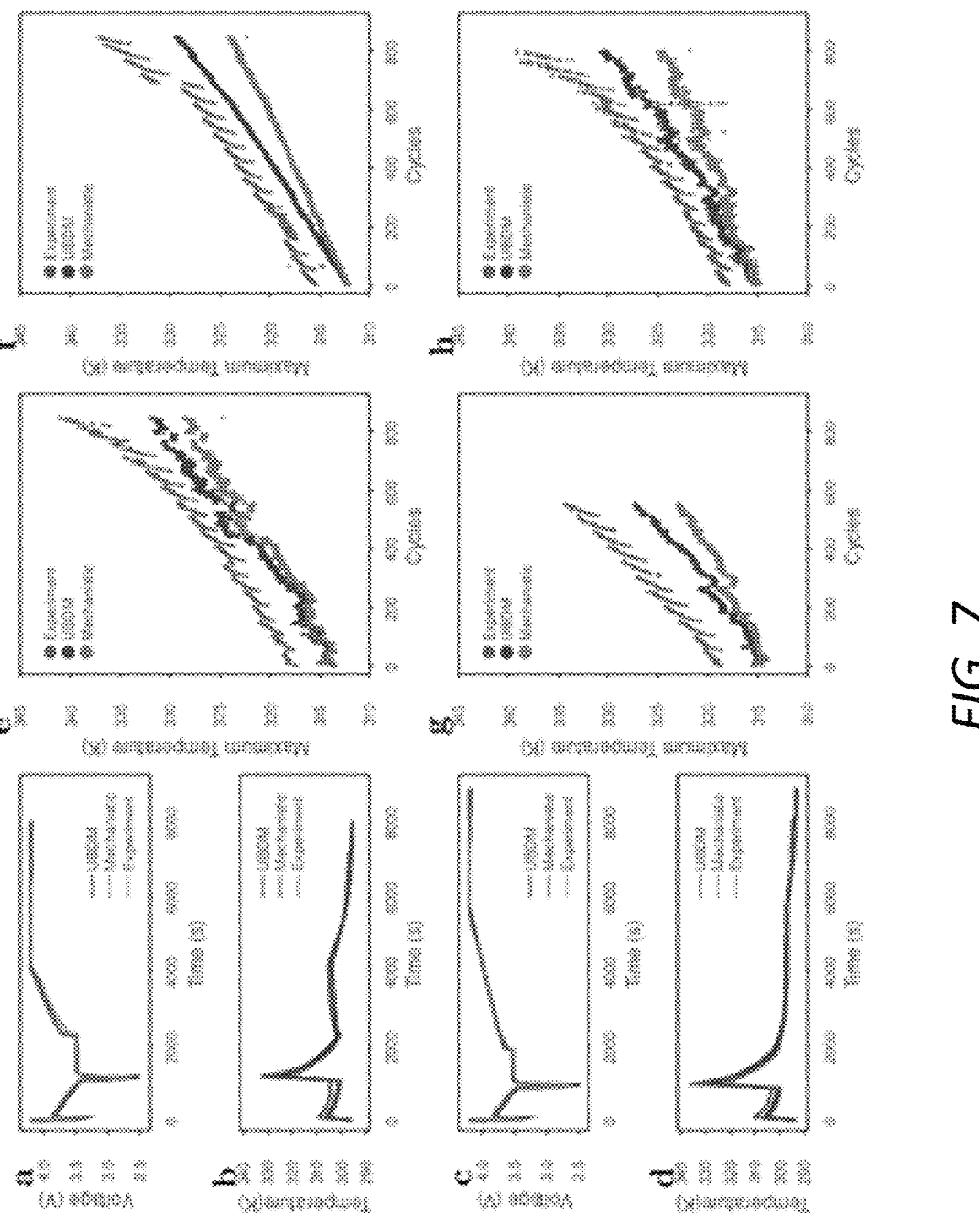
FIG. 7 is a series of graphs showing a comparison of UBSN and MDM voltage and temperature predictions.

FIG. 7 shows a comparison of UBDM and MDM performance predictions. FIGS. 7a-7d show voltage and temperature predictions for VAH15 cycle 500 and VAH24 cycle 750, respectively. FIGS. 7e-7h show the maximum temperature predictions from the MDM and the UBDM for cells VAH01, VAH09, VAH15, and VAH24, respectively. Large improvements can be seen for prediction of maximum temperature by cycles, while smaller improvements exist for MSE predictions of voltage and temperature (note that periodic RPT's have been excluded from the plots of maximum temperature)

While important, the model parameters of charge and resistance do not directly correspond to quantities used by aircraft designers. Therefore, it must be shown that improving the degradation model directly cascades to improvements of the performance model, particularly improvements in accuracy of predictions of voltage and temperature. FIGS. 7a-7d show voltage and temperature predictions for VAH15 and VAH24 (one from the training set and one from the interpolative testing set). While the UBDM does not have a significant impact on the voltage predictions, it does have an impact on temperature predictions, particularly on the maximum temperature. In both cycle profiles shown here, the UBDM is more accurate than the MDM at predicting maximum temperature. This is expanded in FIGS. 7e-7h. In nearly all cases, the maximum temperature predictions are substantially improved by the UBDM over the MDM. Interestingly, this is true even when the UBDM did not improve the overall accuracy as previously defined of the degradation model.

Cell Testing and Data Generation:

This work utilized Sony-Murata 18650 VTC-6 cells. This cell has a rated capacity of 3000 mAh at a nominal voltage of 3.6V. The manufacturer-specified maximum continuous discharge rate is 10 C with a 80° C. upper temperature cut off. This cell is appropriate for evaluation in eVTOL applications as it can sustain high power demand while providing a cell specific energy of 230 Wh/kg.

All cells were tested in a Arbin 200 A cylindrical cell holder paired with a BioLogic BCS-815 modular battery cycler. Cell testing was performed in enclosures that were placed in a temperature chamber that was maintained at 25° C. Cell can surface temperatures were measured via a thermocouple fixed to the cell body with aluminum tape.

Generation of the eVTOL data set was developed from a baseline power profile for a notional eVTOL flight. Battery cell state-of-health was measured for the baseline mission profile and a series of variations on the baseline mission. The variations, included modifying a single variable in the baseline mission profile. For each mission profile, cells were cycled until cell voltage reached 2.5V or cell temperature reached 70° C. during discharge. To measure cell energy capacity a reference performance test was performed at the start of each aging test campaign and following each subsequent set of 50 mission cycles. Each Reference Performance Test (RPT) consisted of measuring capacity by discharging the cell from 100% to 0% state-of-charge at a discharge rate of C/5 until the voltage dropped below 2.5V and an internal resistance measurement at 20% and 60% depth of discharge. After all discharge cycles a rest time was observed to allow the cell to cool to 30° C. Once 30° C. cell temperature was reached a CC-CV charge profile was started with constant current charge at 1 C, followed by constant voltage charge until charge current decayed to C/30 to a (nominally) 4.2V end of charge voltage.

Data Cleanup and Handling

The raw cell testing data was collected in multiple files over the lifetime of the cell. These files were then concatenation for each cell, and the cell data published contains these concatenated files. For the aging parameter optimization, the files were separated by cycle. Cycles are defined as starting at the beginning of the takeoff discharge and ending after the second rest period. A very low fraction (<2%) of the cycles in the data showed evidence of tester malfunction. In the case of missing cycles, it was not possible to know how many cycles were missing, but it is likely that the number is few and that the effects are negligible. More details can be found in the released data for this paper. Additionally, a few changes were made to the simulation protocol as opposed to the experimental protocol. Firstly, rather than simulating the cells until they reached a temperature of 27° C., the simulation rest period was set to last the same length of time as the rest period of the simulation. Secondly, it was observed in the data that the ambient temperature was changing throughout the cell testing campaign. As a result, the ambient temperature used for cooling in the cell model was set to the first value of cell temperature for each cycle. This resulted in empirically good results, particularly during the second rest period, where it can be assumed that this change would have the strongest effect.

Cell Model

The cell model, adapted from one presented by Daigle and Kulkarni, is a simplified coupled electrochemical model consisting of a system of ordinary differential equations, allowing it to be much faster than the coupled system of algebraic and partial differential equations of more complex battery models. It has two principal components: Modeling charge (q) movement and potential (V). The model comprises 4 domains: bulk and surface regions of both the cathode and the anode. Charge flow is governed by applied current between the surfaces of each electrode and by diffusion between the surface and bulk of each electrode, as described in Eq. (1-4). Note that an additional charge transfer term will later be added to the model to represent degradation via charge loss. These equations conserve charge, allowing this model to be faithful to the physics of a battery.

$$\frac{dq_{sp}}{dt} = \frac{1}{D}\left(\frac{q_{bp}}{v_{bp}} - \frac{q_{sp}}{v_{sp}}\right) + I_{app} \tag{1}$$

$$\frac{dq_{bp}}{dt} = -\frac{1}{D}\left(\frac{q_{bp}}{v_{bp}} - \frac{q_{sp}}{v_{sp}}\right) \tag{2}$$

$$\frac{dq_{sn}}{dt} = \frac{1}{D}\left(\frac{q_{bn}}{v_{bn}} - \frac{q_{sn}}{v_{sn}}\right) - I_{app} \tag{3}$$

$$\frac{dq_{bn}}{dt} = -\frac{1}{D}\left(\frac{q_{bn}}{v_{bn}} - \frac{q_{sn}}{v_{sn}}\right) \tag{4}$$

where:
the subscript b represents bulk;
s represents surface
p represents positive;
n represents negative; and
D represents a diffusion coefficient.

Voltage is calculated using a buildup consisting of 5 terms: cathode and anode equilibrium potentials, cathodic and anodic surface overpotentials, and an ohmic overpotential. All overpotentials are also passed through first-order filters to prevent sudden voltage changes. Surface kinetics of each electrode are governed by the Butler-Volmer equations, as shown in Eq. (5):

$$\frac{dV_{\eta p,n}}{dt} = \frac{\frac{RT}{F\alpha}\text{asinh}\left(\frac{J_{p,n}}{2J_{p0,n0}}\right) - V_{\eta p,n}}{\tau_{\eta p,n}} \tag{5}$$

where:
$J_{p,\,n}$ is the current density;
$J_{p0,\,n0}$ is the exchange current density;
V is the overpotential; and
$\tau$ is the time constant for each overpotential.

Cell resistance is modeled by a lumped resistance parameter, and the ohmic overpotential is given in Eq. (6):

$$\frac{dV_{ohm}}{dt} = \frac{IR - V_{ohm}}{\tau_{ohm}} \tag{6}$$

The anode and cathode equilibrium potentials are modeled by the Redlich-Kister polynomials, and are given in Eq. (7). Importantly, while the fitting coefficients are estimated using simulated annealing, they are constrained to obey the second law of thermodynamics. This constraint helps to prevent overfitting and increases the interpretability of the model. It is enforced within the simulated annealing routine, by not allowing the routine to output an OCV curve which is not monotonic.

$$V_{Un,p} = V_{U0n,p} + \frac{RT}{nF}\log\left(\frac{1 - x_{n,p}}{x_{n,p}}\right) + \tag{7}$$
$$\frac{1}{nF}\sum_{i=1}^{N_{n,p}} A_{n,p}(2x_{n,p} - 1)^i - \frac{2x_{n,p}(i-1)(1 - x_{n,p})}{(2x_{n,p} - 1)^{1-i}}$$

where:
$V_{Un,\,p}$ is the reference potential;
R is the ideal gas constant;
n is the number of transferred electrons;
F is Faraday's constant;
$x_{n,\,p}$ is the positive and negative filling fraction (respectively); and
$A_{n,\,p}$ are the fitting coefficients.

The thermal model is based on a lumped parameter model with heat generation terms for ohmic heating and entropic heating. Cooling is convective cooling, owing to the test setup as described above. The equations for the thermal model is given in Eq. (8).

$$\frac{dT}{dt} = \frac{I^2R + \frac{IT\frac{\partial U}{\partial T}}{nF} - hA(T - T_{amb})}{mc_p} \tag{8}$$

where:
I is the current;
R is the resistance;

$$\frac{\partial U}{\partial T}$$

is the entropic coefficient;
h is the conductive coefficient;
A is the surface area (because the surface area of all cells is the same, hA is modelled as a lumped parameter);

m is the cell mass; and $c_p$ is the specific heat.

The cooling model is specific to this dataset. Any cooling model can be used in lieu of Newtonian convection to best approximate cooling for any situation.

Parameter Estimation and Identification

Different parameters were estimated using different techniques. Performance parameters, including all Redlich-Kister coefficients, the diffusion coefficient, the reference potentials, all thermal parameters, and time constants were estimated using simulated annealing. A stochastic optimization technique was chosen to avoid the parameter identifiability issues described previously. The simulated annealing algorithm begins by evaluating the loss function at an initial point θ. Then, using gibbs sampling, a random parameter is chosen to iterate, and a new parameter vector $\theta_{candidate}$ is created by adding a step $\lambda N(0, 1)$ where $\lambda$ depends on the magnitude of the selected parameter, and the loss function is then evaluated at $\theta_{candidate}$. If the new loss function is lower than the previous loss function, then θ is replaced by $\theta_{candidate}$. If the new loss function is higher than the previous loss function, then θ is replaced by $\theta_{candidate}$ with a probability calculated by the Boltzmann distribution:

$$P_{acceptance} = e^{\frac{(L(\theta_{candidate})-L(\theta))}{T}} \tag{9}$$

Over the course of the optimization, the temperature T is lowered to reduce the likelihood of moving to a less optimal parameter vector. This enables the algorithm to exploit and explore the parameter space. Exploration occurs when the temperature is relatively high, because the algorithm will allow movement to a higher loss value. This allows the algorithm to escape some local minima. Exploitation occurs when the temperature is relatively low, forcing the algorithm to move towards the local minima.

The aging parameters (charge and resistance) were identified using a grid-based method. This method was chosen for two reasons. Firstly, because there were only two parameters, and because of the aforementioned speed of the calculation of the loss function for this problem, a grid based method was tractable. Secondly, there was relatively little tolerance for optimization noise in these parameters, and the grid based method produced much less noise than a stochastic method such as simulated annealing. In the grid based method, upper and lower limits for charge and resistance were first identified based on physical constants. The lower resistance limit was defined as 0.01 ohms, and the upper resistance limit was defined as 0.05 ohms. The upper charge limit was defined as 26000 coulombs, and the lower charge limit was set to around 15000 coulombs. Using these limits, a 10 by 10 grid was created and the loss function was evaluated at each point on the grid. At the best points (those with the lowest loss function) the grid was further subdivided and the loss function was re-evaluated for a specified number of subdivisions and number of subgrid points.

Identifying the degradation parameters, including both the mechanistic and UBDM degradation parameters, involved a two-stage process. In the first stage, the parameters were initialized using simulated annealing following from a random starting point, as described above. In the second stage, the parameters were refined using a gradient-based optimization algorithm, Adam. This two-stage process was chosen to solve two problems: firstly, when integrated for a long time interval, such as a battery lifetime, random initialization of Neural Network parameters as is the norm in most machine learning applications can results in highly unstable systems, resulting in unphysical concentrations due to large charge losses or negative charge losses (charge gains). It is often not possible to calculate a gradient based on simulations with unphysical results which cause floating point errors, so a stochastic optimization method is required. Secondly, it is easy to see that initializing a gradient based optimizer with the zero vector results in an equilibrium point at the initialization point, and therefore, training does not occur. Additionally, there are too many parameters in the UBDM to ensure convergence of simulated annealing, and to give the two algorithms a fair comparison requires giving them the same training protocols.

As briefly mentioned in the article, a custom loss function was used to identify the parameters. That function is given in Eq. (10). Herein, the weight was 10 for the voltage error and 1 for the other error terms.

$$L = \sum_t \left( W_V \frac{|V_t - \tilde{V}_t|}{\tilde{V}} + W_T \frac{(T_t - \tilde{T}_t)^2}{\tilde{T}} \right) + W_{MT} \frac{|\max(T_t) - \max(\tilde{T}_t)|}{\tilde{T}} \tag{10}$$

where:

a tilde over the variable indicates that it is the average experimental of the data;

a t subscript indicates that it is taken at timestep t;

W indicates the weight given to each part; and subscripts of W indicates the part of the loss function to which that weight is applied.

Degradation Modeling

To model battery degradation, a multistep process with three steps was used: first, find the parameters which change with aging. Then, fit those parameters to each (SOC) cycle for any given battery life-cycle, and identify whether or not the loss function is increasing as the battery ages. If the loss function is not increasing with time, then the parameters identified are the correct set of aging parameters. If the loss function is increasing with time, then the selection of the aging parameters needs to be revisited. As mentioned previously, because of the requirement for relatively low amounts of noise and the relatively low computational cost of estimating these parameters, the aging parameters were estimated using a grid-based method.

Using this methodology, the precise degradation model can be chosen to fit the generated data once the parameters for each cycle have been estimated. For this work, two separate degradation models were used. The first is referred to herein as the mechanistic model. It is based on physical principles and consists of charge loss due to SEI formation, given by Eq. (11), active material isolation, given by Eq. (12), and lithium plating, given by Eq. (13). Additionally, a resistance increase term is added, given by Eq. (14).

$$\frac{dQ_{sei}}{dt} = \frac{K_{SEI} e^{\frac{-E_{SEI}}{RT}}}{2(1+\lambda\theta)\sqrt{t}} \tag{11}$$

$$j_{pl} = i_{0pl} e^{-\frac{0.5F}{RT}(V_{Un} - V_{\eta n})} \tag{12}$$

$$\frac{dQ_{am}}{dt} = K_{AM} e^{-\frac{E_{AM}}{RT}} SOCI_{app} \tag{13}$$

$$\frac{dR}{dt} = w_d |I_{app}| \tag{14}$$

Combined Physics and Neural Network Degradation Model (UBDM):

A novel degradation model is also disclosed herein which uses Universal Ordinary differential Equations (U-ODE) to predict charge loss and resistance change. Neural Ordinary differential equations (NODE) are a model where the derivative of a function is approximated using a neural network. U-ODE's are an extension of NODE's where only part of the time derivative of the system is approximated using a neural network. In this case, the mechanistic degradation model is supplemented with a U-ODE to improve accuracy and generalization of predictions. The U-ODE neural network is a function of all of the other state variables of the system, as shown in Eq. (17). The full degradation model is given in Eqs. (15, 16):

$$\frac{dQ_{nonmechanistic}}{dt} = NN(u, \theta) \tag{15}$$

$$\frac{dR_{nonmechanisitic}}{dt} = NN(u, \theta) \tag{16}$$

$$u = [q_{sp}, q_{bp}, q_{sn}, q_{bn}, V0, V_{\eta n}, V_{\eta p}, T, R, q_{max}]^T \tag{17}$$

u and $\theta$ are the parameters of the neural network. The mechanistic and non-mechanistic parts of the model are combined to arrive at a final degradation model, the UBDM, which is given by Eqs. (18, 19):

$$\frac{dQ}{dt} = \frac{dQ_{SEI}}{dt} + \frac{dQ_{AM}}{dt} + j_{pl} + \frac{dQ_{nonmechanistic}}{dt} \tag{18}$$

$$\frac{dR}{dt} = \frac{dR_{mechanistic}}{dt} + \frac{dR_{nonmechanistic}}{dt} \tag{19}$$

The loss of charge in the degradation model always occurs at the anode surface, meaning that it consists of a subtraction term added to $q_{sn}$, which is consistent with most research on degradation occurring at the anode. To train the degradation model, a forward sensitivity analysis was performed on the parameters of the neural network to calculate the gradient of the parameters with respect to the loss function. While most NODE implementations use reverse sensitivity analysis to calculate the parameter sensitivities, the small size of this neural network indicates that forward sensitivity will be faster for it. The Adam algorithm was used to train the neural network.

Herein is disclosed a novel physics-informed machine learning model to predict battery degradation. This model was tested against a battery performance and thermal response dataset intended to replicate conditions that could be encountered by an urban air mobility aircraft. The machine learning approach disclosed herein is able to outperform the capability of a standalone physics-based model on predicting degradation of a battery cell, and the improved degradation prediction performance leads to improved performance model performance. This high accuracy and computational efficiency makes this a valuable tool for eVTOL and eSTOL designers. Additionally, the paradigm used herein for combining physics and machine learning will be useful for researchers in a wide range of fields.

The invention claimed is:

1. A method for estimation of the state and health of a battery comprising:
   predicting, using a performance model based on a set of performance parameters, a voltage, a temperature and a state of charge of the battery during a given duty cycle of the battery and
   estimating, using a degradation model, implemented as a neural network, changes in the performance parameters over a lifetime of the battery, the performance parameters including at least residual loss of lithium inventory and ohmic resistance gain, based on an input of a state vector generated by a model of the battery;
   wherein the performance parameters include one or more aging parameters evolved by the degradation model over the lifetime of the battery by a process comprising:
   choosing an initial set of aging parameters;
   evaluating a loss function for each duty cycle of the battery; and
   altering the selection of the aging parameters until the loss function is minimized.

2. The method of claim 1 wherein the parameters of the performance model are estimated to predict performance of the battery.

3. The method of claim 2 wherein the physics-based degradation model models mass, charge and potential redistribution over domains including bulk and surface regions of a cathode and an anode of the battery using ordinary differential equations.

4. The method of claim 1 wherein the aging parameters are those performance parameters for which an estimation changes over the lifetime of the battery.

5. The method of claim 1 wherein the degradation model comprises:
   a physics-based degradation model; and
   a universal function approximator, including, but not limited to a neural network and random forest, implemented using a set of neural differential equations and universal ordinary differential equations for estimating the degradation parameters used by the physics-based degradation model.

6. The method of claim 5 wherein the physics-based degradation model is specific to a particular model of the battery.

7. The method of claim 6 wherein the physics-based degradation model further includes a battery resistance model and a thermal model.

8. The method of claim 5 wherein the physics-based degradation model comprises:
   a charge-loss due to SEI formation component;
   an active material isolation component;
   a lithium plating component; and
   a resistance increase component;
   wherein each of the components are implemented using ordinary differential equations.

9. The method of claim 1 wherein the battery is used in an electric vertical take-off and landing (eVTOL) aircraft and electric short take-off and landing (eSTOL) aircraft.

10. The method of claim 1, implemented in an electrically-powered aircraft, wherein the duty cycle comprises:
   a take-off phase;
   a cruise phase;
   a landing phase;
   a first rest and cooling phase;
   a charging phase; and
   a second rest and cooling phase.

* * * * *